US010065211B2

(12) United States Patent
Ishibashi et al.

(10) Patent No.: US 10,065,211 B2
(45) Date of Patent: Sep. 4, 2018

(54) DEVICE COMPRISING A PANEL AND PIEZOELECTRIC ELEMENT

(71) Applicant: KYOCERA CORPORATION, Kyoto (JP)

(72) Inventors: Kenji Ishibashi, Kawasaki (JP); Ken Tomatsu, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 710 days.

(21) Appl. No.: 14/625,188

(22) Filed: Feb. 18, 2015

(65) Prior Publication Data

US 2015/0239011 A1 Aug. 27, 2015

(30) Foreign Application Priority Data

Feb. 27, 2014 (JP) ................................ 2014-037514

(51) Int. Cl.
*H01L 41/08* (2006.01)
*B06B 1/06* (2006.01)
*G10K 9/122* (2006.01)

(52) U.S. Cl.
CPC ............ *B06B 1/0644* (2013.01); *G10K 9/122* (2013.01)

(58) Field of Classification Search
CPC ....... H04R 17/00; B06B 1/0644; G10K 9/122
See application file for complete search history.

(56) References Cited

U.S. PATENT DOCUMENTS 6,420,818 B1 * 7/2002 Kishimoto ............... H04R 7/20 310/324
6,700,314 B2 * 3/2004 Cuhat .................. H01L 41/047 310/319
7,141,919 B1 * 11/2006 Hamada ................ H04R 17/00 310/348

(Continued)

FOREIGN PATENT DOCUMENTS

JP 59-067074 U1 5/1984
JP 2005-348193 A 12/2005

(Continued)

OTHER PUBLICATIONS

An Office Action; "Notice of Reasons for Rejection," mailed by the Japanese Patent Office dated Jun. 6, 2017, which corresponds to Japanese Patent Application No. 2014-037514; with English language Concise Explanation.

(Continued)

*Primary Examiner* — J. San Martin
(74) *Attorney, Agent, or Firm* — Studebaker & Brackett PC

(57) ABSTRACT

The present invention provides a device with a piezoelectric element disposed at a location other than near an edge of a panel. A device includes a panel and a piezoelectric element disposed in a predetermined region on a planar surface of the panel. The panel vibrates in response to vibration of the piezoelectric element so as to transmit sound to a human body contacting the panel. By the piezoelectric element being disposed in the predetermined region of the panel, the (Continued)

center of the piezoelectric element is located within a range of 40% to 60% of the distance from one edge to the other edge of the panel in a first direction and within a range of 40% to 60% of the distance from one edge to the other edge of the panel in a second direction perpendicular to the first direction.

13 Claims, 11 Drawing Sheets

(56) References Cited

U.S. PATENT DOCUMENTS

| | | | | |
|---|---|---|---|---|
| 8,988,886 | B1 * | 3/2015 | Arao | G06F 1/1656 361/679.01 |
| 9,195,058 | B2 * | 11/2015 | Zarrabi | G02F 1/29 |
| 9,350,832 | B2 | 5/2016 | Horii | |
| 9,818,805 | B2 * | 11/2017 | Choi | H01L 27/3225 |
| 2001/0004180 | A1 * | 6/2001 | Kishimoto | H04R 1/06 310/324 |
| 2006/0140424 | A1 | 6/2006 | Kobayashi | |
| 2006/0227981 | A1 | 10/2006 | Miyata | |
| 2010/0225600 | A1 * | 9/2010 | Dai | G06F 3/016 345/173 |
| 2013/0308798 | A1 | 11/2013 | Lee | |
| 2013/0335211 | A1 * | 12/2013 | Kobayashi | G06F 1/1626 340/407.2 |
| 2014/0355792 | A1 * | 12/2014 | Nabata | H04M 1/035 381/162 |
| 2015/0070864 | A1 * | 3/2015 | Rainer | H01L 21/563 361/782 |
| 2015/0172823 | A1 * | 6/2015 | Fukuoka | B06B 1/0611 381/162 |
| 2015/0256656 | A1 | 9/2015 | Horii | |
| 2016/0014525 | A1 * | 1/2016 | Park | H04R 17/00 381/190 |
| 2017/0303048 | A1 * | 10/2017 | Hooton | H04R 17/005 |

FOREIGN PATENT DOCUMENTS

| | | | |
|---|---|---|---|
| JP | 2012-144694 | A | 8/2012 |
| JP | 2013-229843 | A | 11/2013 |
| JP | 2013-256240 | A | 12/2013 |
| WO | 2013-047609 | A1 | 4/2013 |

OTHER PUBLICATIONS

An Office Action; "Notice of Reasons for Rejection," mailed by the Japanese Patent Office dated Feb. 6, 2018, which corresponds to Japanese Patent Application No. 2014-037514; with English language Concise Explanation.

* cited by examiner

A-A

A-A

A-A

B-B

A-A

A-A

DEVICE COMPRISING A PANEL AND PIEZOELECTRIC ELEMENT

CROSS-REFERENCE TO RELATED APPLICATION

This application claims priority to and the benefit of Japanese Patent Application No. 2014-037514 filed Feb. 27, 2014, the entire contents of which are incorporated herein by reference.

TECHNICAL FIELD

The present invention relates to a device that vibrates a panel by applying a predetermined electric signal (audio signal) to a piezoelectric element in order to transmit sound (for example, air-conducted sound and human body vibration sound) to a user by transmitting the vibration of the panel to the user's body.

BACKGROUND

Patent Literature 1 discloses that air-conducted sound and bone-conducted sound are known examples of sound transmitted to a human being from a device such as a mobile phone. As the air-conducted sound, Patent Literature 1 discloses a sound that is transmitted to the user's auditory nerve by air vibrations, caused by a vibrating object, that are transmitted through the external ear canal to the eardrum and cause the eardrum to vibrate. As bone-conducted sound, Patent Literature 1 discloses a sound that is transmitted to the user's auditory nerve through a portion of the user's body (such as the cartilage of the outer ear) that is contacting a vibrating object.

Patent Literature 1 also discloses a telephone that transmits sound to a user by air-conducted sound and bone-conducted sound, in which a rectangular vibrating body, formed from a piezoelectric bimorph and a flexible substance, is attached to an outer surface of a housing via an elastic member. When voltage is applied to the piezoelectric bimorph of the vibrating body, the piezoelectric bimorph expands and contracts in the longitudinal direction, thereby causing the vibrating body to vibrate. Patent Literature 1 also discloses that air-conducted sound and bone-conducted sound are transmitted to the user when the user contacts the vibrating body to the auricle.

Patent Literature 2 discloses joining a piezoelectric element near an edge in the lengthwise direction of a mainly rectangular panel and vibrating the panel by driving the piezoelectric element.

CITATION LIST

Patent Literature 1: JP 2005-348193 A
Patent Literature 2: JP 2013-229843 A

SUMMARY

In the device disclosed in Patent Literature 1, an extremely small, rectangular vibrating body measuring approximately 0.8 cm long by 3.2 cm wide is attached to the outer surface of the housing of a mobile phone or the like. Therefore, the problems occurring when the vibrating body is a larger size are not even considered.

Furthermore, in the device disclosed in Patent Literature 2, a piezoelectric element is joined near an edge in the lengthwise direction of a mainly rectangular panel, and for example no specific consideration is made for the case of disposing a piezoelectric element at a location other than near an edge of the panel.

The present invention provides a device that can transmit a better sound to a user by disposing a piezoelectric element at a location other than near an edge of a panel.

A device according to the present invention includes a panel; and a piezoelectric element disposed in a predetermined region on a planar surface of the panel, such that the panel vibrates in response to vibration of the piezoelectric element so as to transmit sound to a human body contacting the panel, and by the piezoelectric element being disposed in the predetermined region on the planar surface of the panel, a center of the piezoelectric element is located within a range of 40% to 60% of a distance from one edge to another edge of the panel in a first direction and within a range of 40% to 60% of a distance from one edge to another edge of the panel in a second direction perpendicular to the first direction.

Another device according to the present invention includes a panel; and a piezoelectric element disposed in a predetermined region on a planar surface of the panel, such that the panel vibrates in response to vibration of the piezoelectric element so as to transmit sound to a human body contacting the panel, and by the piezoelectric element being disposed in the predetermined region on the planar surface of the panel, a distance from one edge of the panel in a first direction to a center of the piezoelectric element, a distance from another edge of the panel in the first direction to the center of the piezoelectric element, a distance from one edge of the panel in a second direction, which is perpendicular to the first direction, to the center of the piezoelectric element, and a distance from another edge of the panel in the second direction to the center of the piezoelectric element are all 1 cm or more.

Another device according to the present invention includes a panel; and a piezoelectric element disposed in a predetermined region on a planar surface of the panel, such that the panel vibrates in response to vibration of the piezoelectric element so as to transmit sound to a human body contacting the panel, and by the piezoelectric element being disposed in the predetermined region on the planar surface of the panel, a distance from one edge of the panel in a first direction to a center of the piezoelectric element and a distance from another edge of the panel in the first direction to the center of the piezoelectric element are equivalent, and a distance from one edge of the panel in a second direction, which is perpendicular to the first direction, to the center of the piezoelectric element and a distance from another edge of the panel in the second direction to the center of the piezoelectric element are equivalent.

Another device according to the present invention includes a panel; and a piezoelectric element disposed in a predetermined region on a planar surface of the panel, such that the panel vibrates in response to vibration of the piezoelectric element so as to transmit sound to a human body contacting the panel, and by the piezoelectric element being disposed in the predetermined region on the planar surface of the panel, a value yielded by dividing a distance from one edge of the panel in a first direction to a center of the piezoelectric element by a distance from another edge of the panel in the first direction to the center of the piezoelectric element is within a predetermined range, and a value yielded by dividing a distance from one edge of the panel in a second direction, which is perpendicular to the first direction, to the center of the piezoelectric element by a distance from another edge of the panel in the second direction to the center of the piezoelectric element is within the predetermined range.

Another device according to the present invention includes a circular panel; and a piezoelectric element disposed in a predetermined region on a planar surface of the panel, such that the panel vibrates in response to vibration of the piezoelectric element so as to transmit sound to a human body contacting the panel, and by the piezoelectric element being disposed in the predetermined region on the planar surface of the panel, a center of the piezoelectric element is located within a range of a circle that is concentric with the panel and has a radius yielded by multiplying a radius of the panel by a predetermined value larger than 0 and smaller than 1.

The panel may be circular.

The panel may also be rectangular.

The device preferably further includes a first housing including a first surface and a second surface; and a display unit disposed on the first surface, such that the panel is disposed on the second surface.

The second surface preferably faces the first surface.

The device preferably further includes a second housing removably attached to the first housing.

The device preferably further includes a sound output unit in the first housing, such that when the first housing is attached to the second housing, the sound output unit outputs sound, and when the first housing is detached from the second housing, the piezoelectric element is driven.

The sound output unit is preferably provided on the first surface of the first housing.

The sound output unit is preferably constituted by a piezoelectric element disposed in the first housing.

The piezoelectric element is preferably a stack-type piezoelectric element.

The device preferably further includes a shaft of a timepiece, such that the shaft includes a hollow cavity, and the piezoelectric element is inserted in the hollow cavity so that a tip of the piezoelectric element contacts the panel.

The piezoelectric element preferably does not contact an inner side of the shaft.

Another device according to the present invention includes a panel; and a piezoelectric element disposed in a predetermined region of the panel, the panel flexing in response to flexure of the piezoelectric element so as to transmit sound to a human body contacting the panel.

Another device according to the present invention includes a housing provided with a display unit; and a stack-type piezoelectric element disposed in a predetermined region on a planar surface of a face of the housing opposite the display unit.

The device preferably further includes a band for fixing the device to a predetermined object.

According to the present invention, it is possible to provide a device that can transmit a better sound to a user by disposing a piezoelectric element at a location other than near an edge of a panel.

BRIEF DESCRIPTION OF DRAWINGS

The present invention will be further described below with reference to the accompanying drawings, wherein.

DESCRIPTION OF EMBODIMENTS

The following describes embodiments of the present invention.

Figure 1:
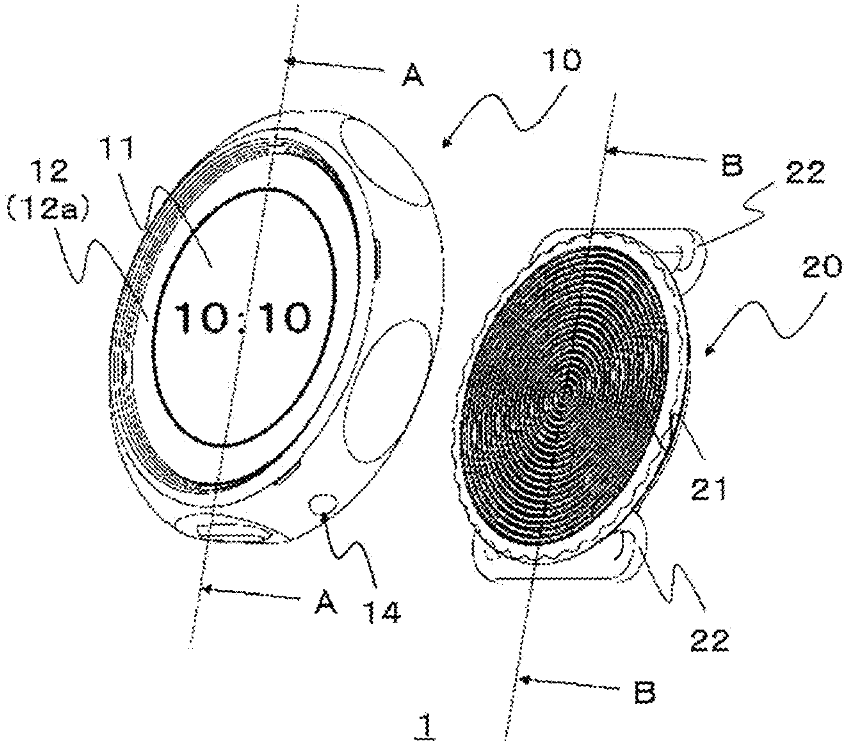
FIG. 1 illustrates the external appearance of a device according to Embodiments 1 to 6 of the present invention.

FIG. 1 illustrates the external appearance of a device according to Embodiments 1 to 6 of the present invention.

As illustrated in FIG. 1, a device 1 according to Embodiments 1 to 6 includes a first housing 10 and a second housing 20.

The first housing 10 is at least provided with a display unit 11, a touch panel 12, and a microphone hole 14.

The display unit 11 displays information input by a non-illustrated control unit (referred to below as the control unit). The control unit may, for example, be a CPU or the like and may be mounted in the first housing.

The panel 12 (first panel 12*a*) is, for example, a panel configured using glass, acrylic, sapphire, or the like, or a touch panel that detects contact by the user or the like.

The panel 12 (first panel 12*a*) is, for example, circular. The panel 12 (first panel 12*a*) is not limited to being circular and may, for example, be square. In other words, the panel 12 (first panel 12*a*) may be such that the length in a certain direction is equivalent to the length in another direction perpendicular to the certain direction. The panel 12 (first panel 12*a*) may also be rectangular.

In the case of being circular, the panel 12 (first panel 12*a*) may have a radius from 1 cm to 6 cm. In the case of being square, one side of the panel 12 (first panel 12*a*) may be 3 cm or more.

The microphone hole 14 is provided to input sound, such as the user's speech, into a microphone provided within the first housing.

The second housing 20 is provided with a seat 21 and band attaching portions 22.

The seat 21 is a fixing portion that detachably fixes the first housing 10 to the second housing 20. When the first housing 10 is fixed to the second housing 20 by the fixing portion, the bottom face of the first housing 10 (the face opposite the face on which the panel 12 is provided; the same holding below) and the seat 21 face each other.

The ends of a band (or a strap or belt) are attached to the band attaching portions 22. By wrapping the band around the user's arm, head, or the like, the second housing 20 is fixed to the user's arm, head, or the like. In this way, the user can, for example, view the display unit 11 provided on the first housing 10 fixed to the second housing 20.

Embodiment 1

The following describes Embodiment 1 of the present invention.

Figure 2:
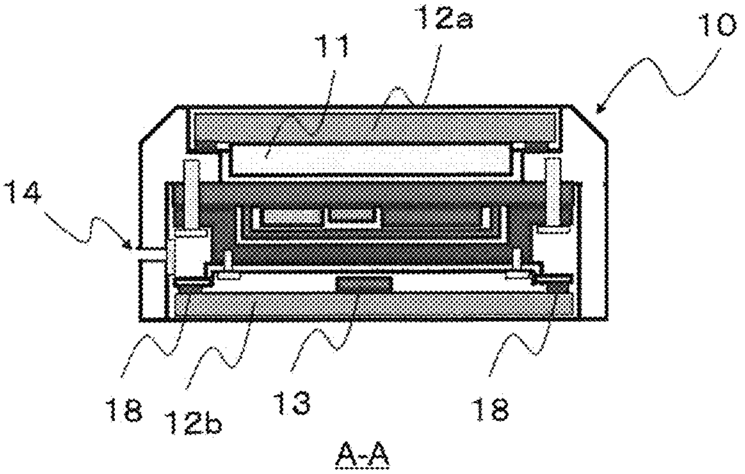
FIG. 2 is an A-A cross-section of the device according to Embodiment 1 of the present invention.

FIG. 2 is an A-A cross-section of the device according to Embodiment 1 of the present invention.

As illustrated in FIG. 2, the device 1 according to Embodiment 1 includes, on the bottom face thereof, a second panel **12*b* and a first piezoelectric element 13**.

The second panel **12*b* may be similar to the above-described first panel 12*a***.

The second panel **12*b* is adhered to a case inside the first housing 10 by an adhering member 18. The adhering member 18** may, for example, be double-sided tape or adhesive.

The first piezoelectric element 13 is, for example, a piezoelectric element configured using ceramic or crystal. The piezoelectric element 13 may also be a unimorph, bimorph, or laminated piezoelectric element. Such a laminated piezoelectric element may be configured with a laminated structure formed by a plurality of dielectric layers composed of, for example, lead zirconate titanate (PZT) and electrode layers disposed between the dielectric layers.

The first piezoelectric element 13 is disposed in a predetermined region (first region 31, second region 32, third region 33, fourth region 34, or fifth region 35; the same holding below) on a planar surface of the back face (the face opposite the face exposed to the outside; the same holding below) of the second panel **12*b*. For example, the first piezoelectric element 13 is adhered to the second panel 12*b*** by an adhering member. The adhering member may, for example, be double-sided tape or adhesive.

Stating that the first piezoelectric element 13 is disposed in the first region 31 on a planar surface of the back face of the second panel **12*b* means that the center of the first piezoelectric element 13 is located within a range of 40% to 60% of the distance from one edge to the other edge of the second panel 12*b* in a first direction and within a range of 40% to 60% of the distance from one edge to the other edge of the second panel 12*b* in a second direction perpendicular to the first direction. The center of the first piezoelectric element 13 is the intersection of the diagonal lines of the face of the first piezoelectric element 13 in contact with the second panel 12*b***.

Figure 10:
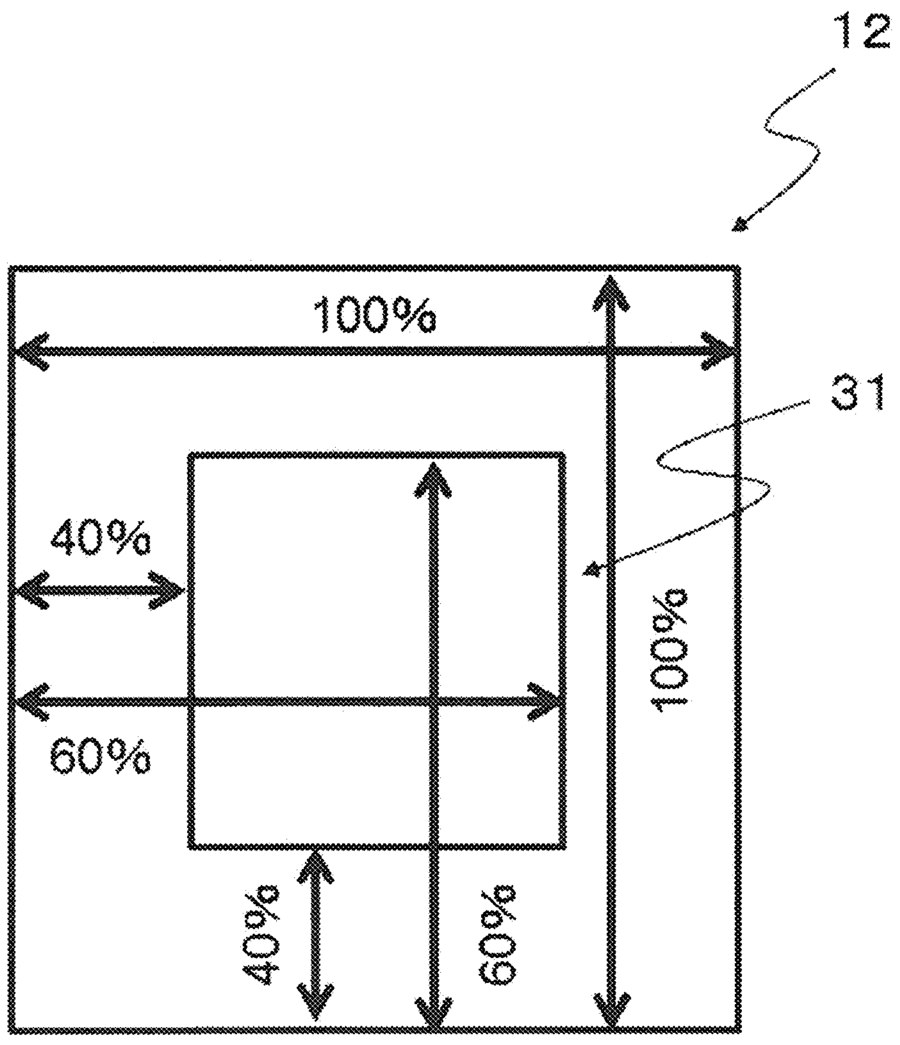
FIG. 10 illustrates a first region in the device according to Embodiment 1 of the present invention.

The first region 31 discussed here is illustrated in FIG. 10.

For example, when the second panel **12*b* is square, and the distance from one edge to the other edge in the lengthwise direction and widthwise direction is 3 cm, then the first piezoelectric element 13 is disposed in the first region 31 on a planar surface of second panel 12*b* when the center of the first piezoelectric element 13** is positioned so that the distance from the edges in the lengthwise direction and the widthwise direction is in a range of 1.2 cm to 1.8 cm.

Stating that the first piezoelectric element 13 is disposed in the second region 32 on a planar surface of the back face of the second panel **12*b* means that the distance from one edge of the second panel 12*b* in a first direction to the center of the first piezoelectric element 13, the distance from the other edge of the second panel 12*b* in the first direction to the center of the first piezoelectric element 13, the distance from one edge of the second panel 12*b* in a second direction, which is perpendicular to the first direction, to the center of the first piezoelectric element 13, and the distance from the other edge of the second panel 12*b* in the second direction to the center of the first piezoelectric element 13** are all 1 cm or more.

Figure 11:
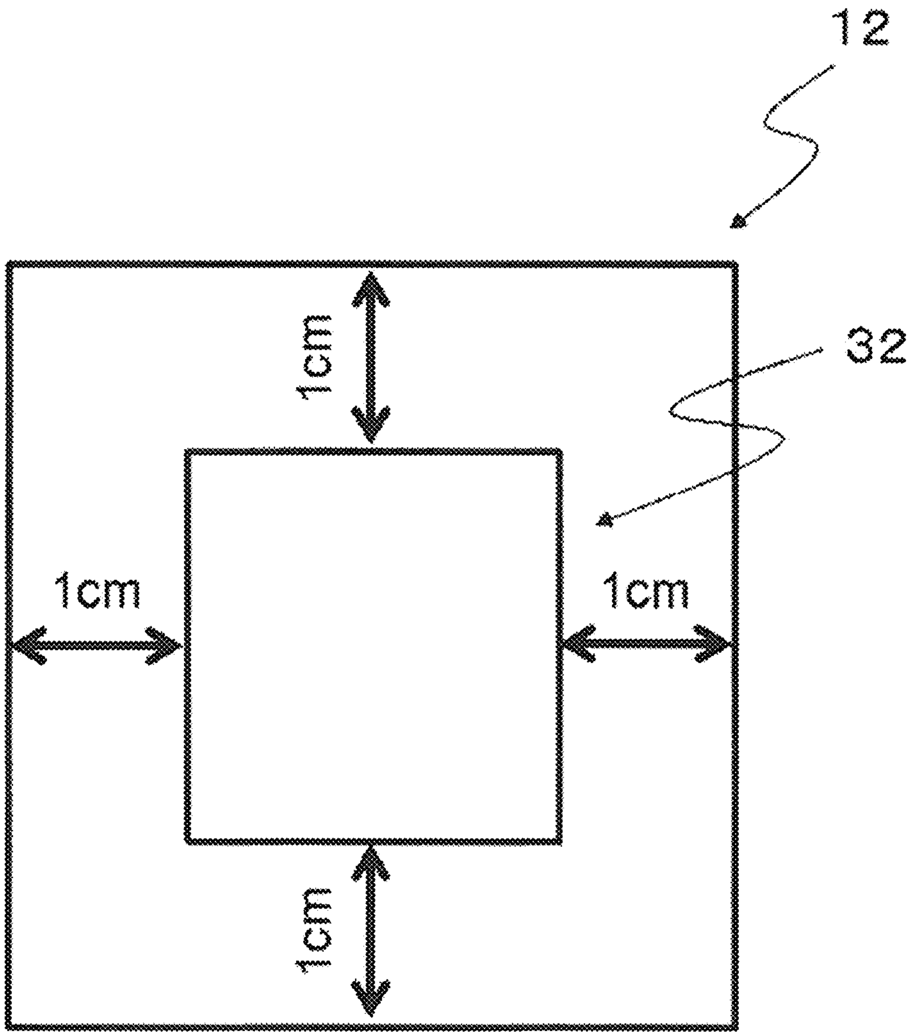
FIG. 11 illustrates a second region in the device according to Embodiment 1 of the present invention.

The second region 32 discussed here is illustrated in FIG. 11.

For example, when the second panel **12*b* is square, then the first piezoelectric element 13 is disposed in the second region 32 of the second panel 12*b* when the distance from one edge in the lengthwise direction to the center of the first piezoelectric element 13, the distance from the other edge in the lengthwise direction to the center of the first piezoelectric element 13, the distance from one edge in the widthwise direction, which is perpendicular to the lengthwise direction, to the center of the first piezoelectric element 13, and the distance from the other edge in the widthwise direction to the center of the first piezoelectric element 13** are all 1 cm or more.

Stating that the first piezoelectric element 13 is disposed in the third region 33 on a planar surface of the second panel **12*b* means that the distance from one edge of the second panel 12*b* in a first direction to the center of the first piezoelectric element 13 and the distance from the other edge of the second panel 12*b* in the first direction to the center of the first piezoelectric element 13 are equivalent, and the distance from one edge of the second panel 12*b* in a second direction, which is perpendicular to the first direction, to the center of the first piezoelectric element 13 and the distance from the other edge of the second panel 12*b* in the second direction to the center of the first piezoelectric element 13** are equivalent.

Figure 12:
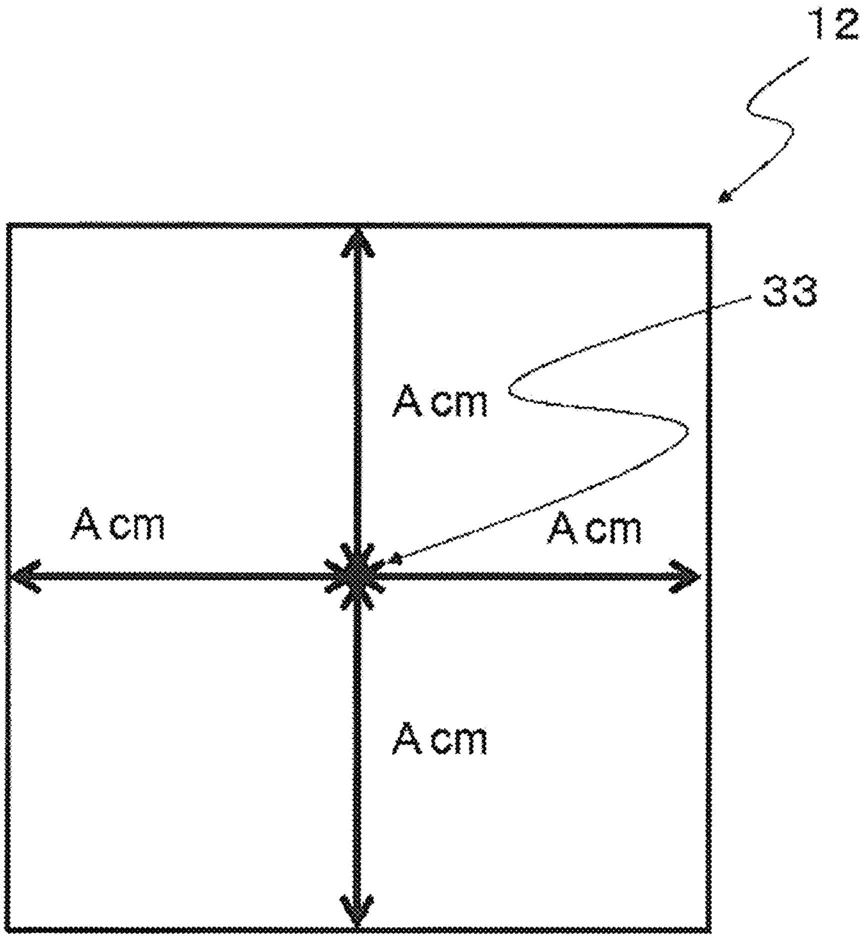
FIG. 12 illustrates a third region in the device according to Embodiment 1 of the present invention.

The third region 33 discussed here is illustrated in FIG. 12. FIG. 12 shows the distances as A cm.

For example, when the second panel **12*b* is square, then the first piezoelectric element 13 is disposed in the third region 33 of the second panel 12*b* when the distance from one edge in the lengthwise direction to the center of the first piezoelectric element 13 and the distance from the other edge in the lengthwise direction to the center of the first piezoelectric element 13 are equivalent, and the distance from one edge in the widthwise direction, which is perpendicular to the lengthwise direction, to the center of the first piezoelectric element 13 and the distance from the other edge in the widthwise direction to the center of the first piezoelectric element 13** are equivalent.

Stating that the first piezoelectric element 13 is disposed in the fourth region 34 on a planar surface of the second panel **12*b* means that the value yielded by dividing the distance from one edge of the second panel 12*b* in a first direction to the center of the first piezoelectric element 13 by the distance from the other edge of the second panel 12*b* in the first direction to the center of the first piezoelectric element 13 is within a predetermined range, and the value yielded by dividing the distance from one edge of the second panel 12*b* in a second direction, which is perpendicular to the first direction, to the center of the first piezoelectric element 13 by the distance from the other edge of the second panel 12*b* in the second direction to the center of the first piezoelectric element 13** is within the predetermined range. Being within the predetermined range means being from 1 or more to 15 or less.

Figure 13:
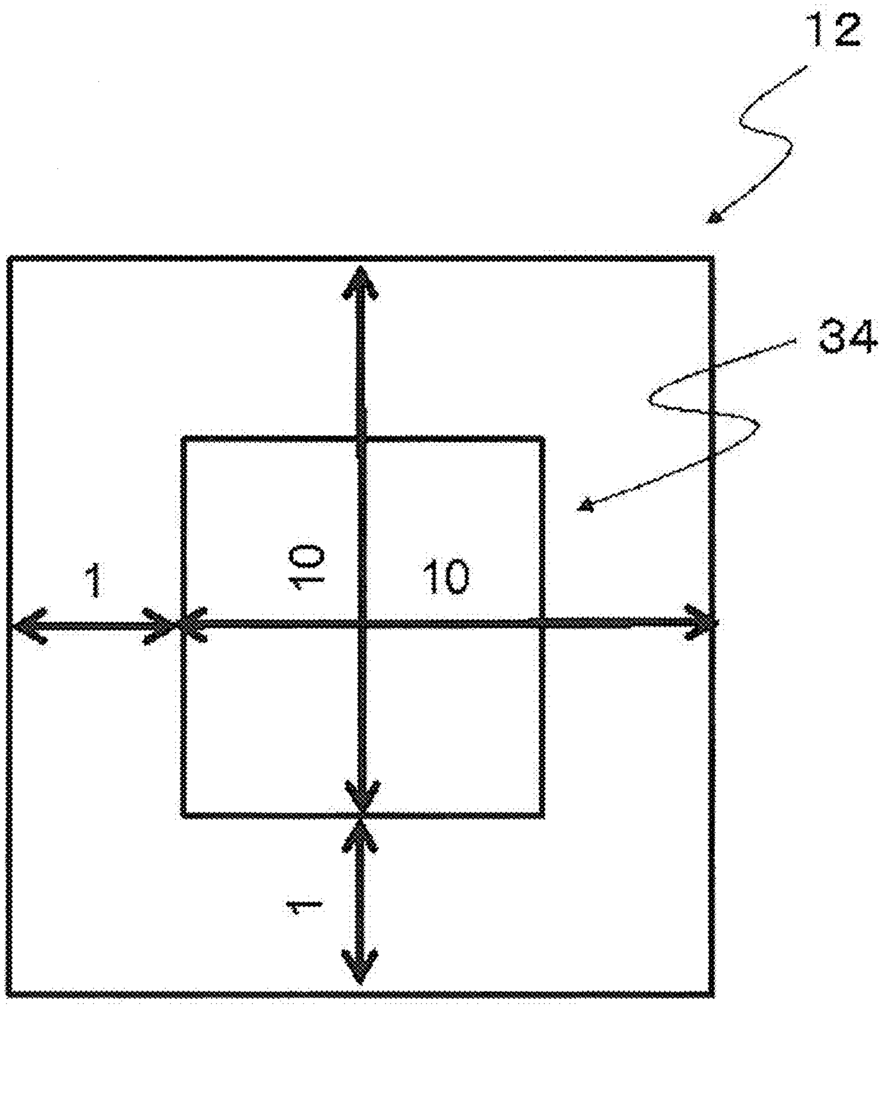
FIG. 13 illustrates a fourth region in the device according to Embodiment 1 of the present invention.

The fourth region 34 discussed here is illustrated in FIG. 13.

Stating that the first piezoelectric element 13 is disposed in the fifth region 35 on a planar surface of the second panel 12*b* may mean that the second panel 12*b* is circular, and that the center of the first piezoelectric element 13 is located within a range of a circle that is concentric with the second panel 12*b* and has a radius yielded by multiplying the radius of the second panel 12*b* by a predetermined value.

This predetermined value is larger than 0 and is 0.5 or less.

Figure 14:
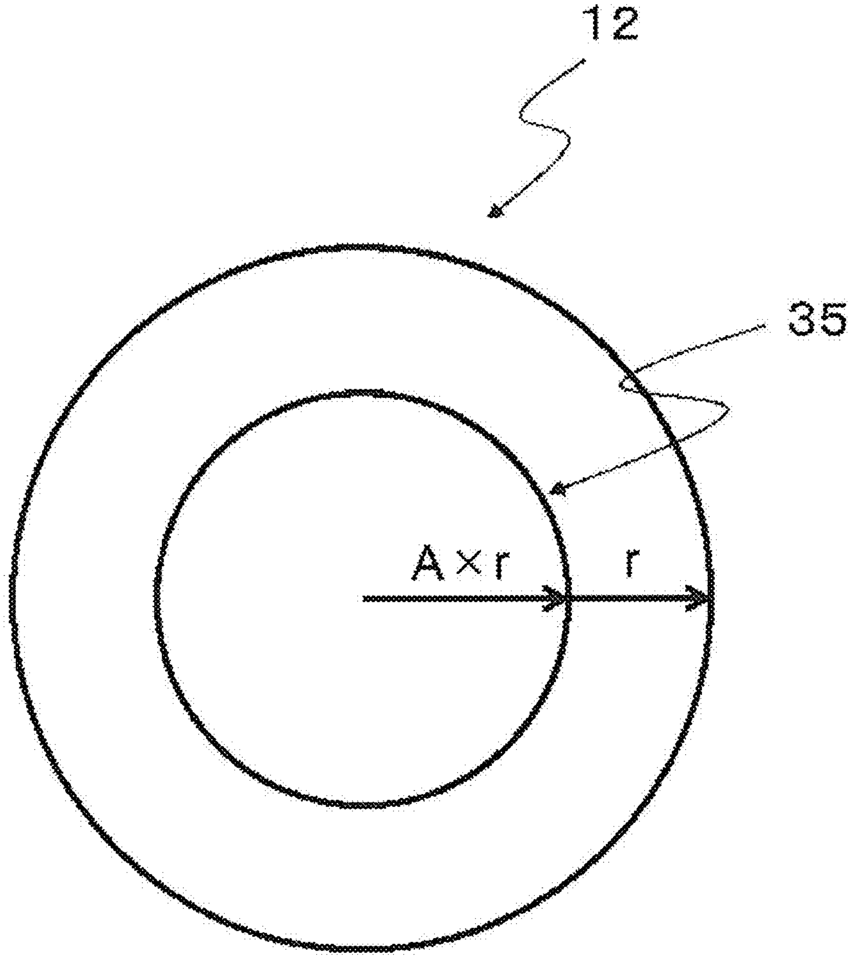
FIG. 14 illustrates a fifth region in the device according to Embodiment 1 of the present invention.

The fifth region 35 discussed here is illustrated in FIG. 14. In FIG. 14, r represents the radius, and A represents the predetermined value.

The first piezoelectric element 13 vibrates, expands and contracts, bends, or flexes upon application of an electric signal (voltage) output by the control unit. The electric signal is related to sound.

By the first piezoelectric element 13 vibrating, expanding and contracting, bending, or flexing, the second panel 12*b* vibrates, expands and contracts, bends, or flexes in conjunction with the vibration, expansion and contraction, bending, or flexure of the first piezoelectric element 13, thereby transmitting sound to a human body in contact with the second panel 12*b*.

By disposing the first piezoelectric element 13 in a predetermined region on the back face of the second panel 12*b*, the sound pressure (dBa) in a low range (for example, 300 Hz to 700 Hz) is better than when disposing the first piezoelectric element 13 near an edge of the second panel 12*b*.

Therefore, according to Embodiment 1 of the present invention, a larger volume of sound can be transmitted to the user in contact with the second panel 12*b*.

Furthermore, since the second panel 12*b* is a uniform shape, such as a circle or a square, the sound pressure does not drop as easily in a frequency band of speech (such as 300 Hz to 3.4 kHz) as when, for example, the second panel 12*b* is a non-uniform shape such as a rectangle.

Therefore, high-quality sound can be transmitted to the user.

Embodiment 2

The following describes Embodiment 2 of the present invention.

Figure 3:
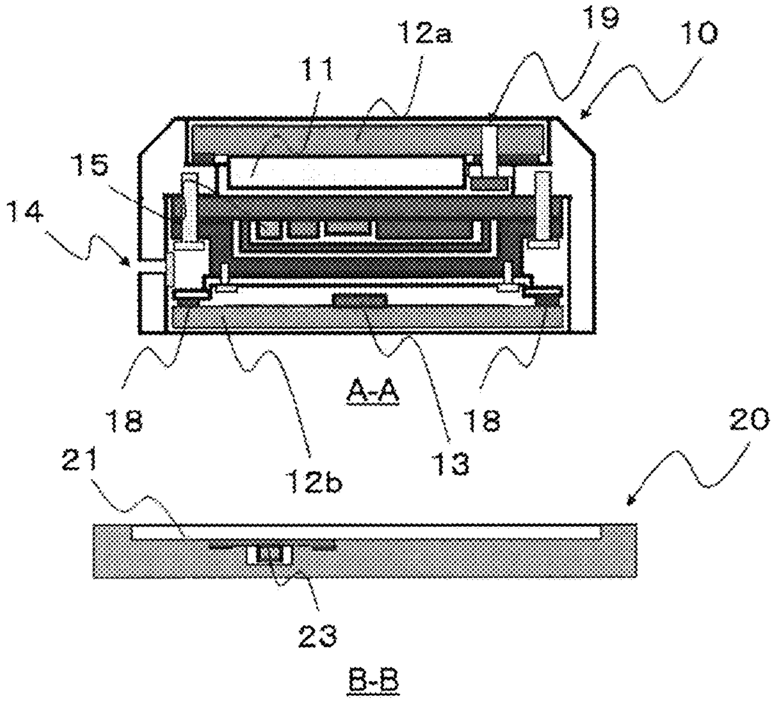
FIG. 3 is an A-A cross-section and a B-B cross-section of the device according to Embodiment 2 of the present invention.

FIG. 3 is an A-A cross-section and a B-B cross-section of a device according to Embodiment 2 of the present invention.

As illustrated in FIG. 3, a device 1 according to Embodiment 2 includes, in addition to the components of the device 1 according to Embodiment 1, a Hall element 15 and a sound output unit 19 in the first housing 10 and a magnet 23 in the second housing 20.

The Hall element 15 is an element that uses the Hall effect to detect a magnetic field. By detecting the magnetic field of the magnet 23 provided in the second housing 20, the control unit detects whether or not the first housing 10 is attached to the seat 21 of the second housing 20. Specifically, when the Hall element 15 has detected the magnetic field of the magnet 23, the control unit determines that the first housing 10 is attached to the seat 21 of the second housing 20, whereas when the Hall element 15 does not detect the magnetic field of the magnet 23, the control unit determines that the first housing 10 has been detached from the seat 21 of the second housing 20.

The means for detecting detachment of the first housing 10 from the seat 21 of the second housing 20 is not limited to the above means constituted by the Hall element 15 and the magnet 23. Instead, it is possible to provide only an illumination sensor in the second housing 20. Any other structure that can detect detachment of the first housing 10 from the seat 21 of the second housing 20 is also possible.

The sound output unit 19 may, for example, be a dynamic speaker. As illustrated in FIG. 3, a sound emission hole for the sound output unit 19 is provided on the surface at the first panel 12*a* side. The sound emission hole of the sound output unit 19 is not limited to being provided on the surface at the first panel 12*a* side and may be provided anywhere other than on the surface at the second panel 12*b* side.

Instead of a structure including a dynamic speaker and its sound emission hole, the sound output unit 19 may be configured by adhering a piezoelectric element to the first panel 12*a*. When adopting this structure, the first panel 12*a* may transmit sound to the user by expanding and contracting, bending, flexing, or vibrating in response to the piezoelectric element expanding and contracting, bending, flexing, or vibrating. In this case, an electric signal (voltage) may be input into the piezoelectric element from the control unit, and in response, the piezoelectric element may expand and contract, bend, flex, or vibrate.

The control unit controls the destination of the electric signal corresponding to sound in accordance with whether the first housing 10 is attached to or detached from the second housing 20. The control unit sets the destination of the electric signal to the first piezoelectric element 13 when the first housing 10 is detached from the second housing 20 and to the sound output unit 19 when the first housing 10 is attached to the second housing 20.

In this way, when the first housing 10 is attached, sound is output from the sound output unit 19, whereas when the first housing 10 is detached, sound is transmitted to the user through the second panel 12*b*.

Accordingly, the user can hear sound regardless of whether the first housing 10 is attached, and furthermore, outputting sound in accordance with the state of attachment of the first housing 10 improves usability.

Embodiment 3

The following describes Embodiment 3 of the present invention.

Figure 4:
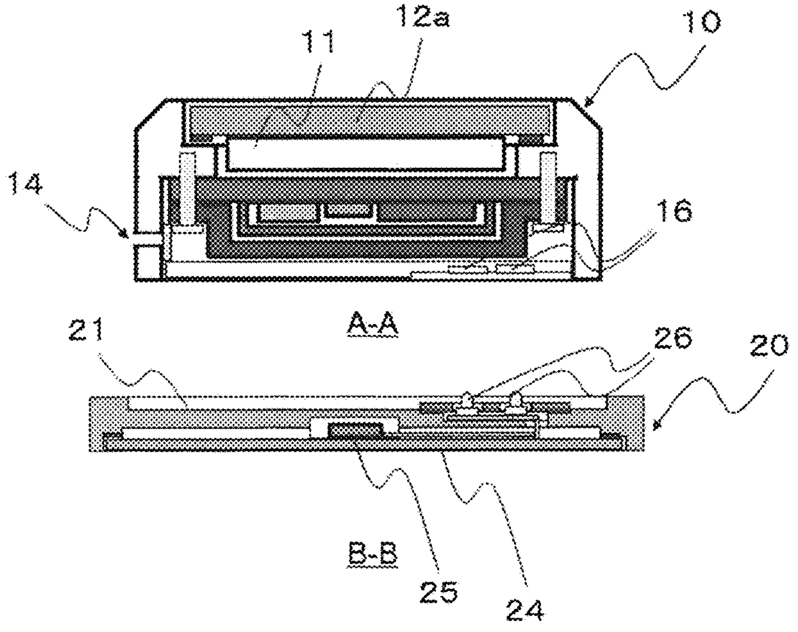
FIG. 4 is an A-A cross-section and a B-B cross-section of the device according to Embodiment 3 of the present invention.

FIG. 4 is an A-A cross-section and a B-B cross-section of a device according to Embodiment 3 of the present invention.

As illustrated in FIG. 4, in a device 1 according to Embodiment 3 of the present invention, as compared to the device 1 according to Embodiment 1, the second panel 12*b* and the first piezoelectric element 13 are removed from the first housing 10, output terminals 16 are further provided in the first housing 10, and a third panel 24, second piezoelectric element 25, and input terminals 26 are further provided in the second housing 20.

The display unit 11, first panel 12*a*, and microphone hole 14 provided in the first housing 10 and the seat 21 provided in the second housing 20 are similar to Embodiment 1.

The output terminals 16 are for outputting, to the connected input terminals 26, a signal output by the control unit. This signal includes the case of an electric signal (voltage) for driving the second piezoelectric element 25.

The third panel 24 may, for example, be similar to the second panel 12*b*.

The third panel 24 is provided on the opposite side of the second housing 20 from the seat 21. The third panel 24 vibrates, expands and contracts, bends, or flexes in response to vibration, expansion and contraction, bending, or flexure of the second piezoelectric element 25, thereby transmitting sound to a human body in contact with the third panel 24.

The second piezoelectric element 25 may, for example, be a piezoelectric element similar to the first piezoelectric element 13.

The second piezoelectric element 25 vibrates, expands and contracts, bends, or flexes upon application of an electric signal (voltage) output by the input terminals 26.

The second piezoelectric element 25 is adhered to a predetermined region of the third panel 24 by adhesive or double-sided tape.

The input terminals 26 receive an electric signal (voltage) output by the output terminals 16 and, for example, output (apply) the electric signal to the second piezoelectric element 25.

With this structure, in the device 1 according to Embodiment 3, the electric signal (voltage) related to speech output by the control unit is output (applied) via the output terminals 16 and the input terminals 26 to the piezoelectric element 25 disposed in the second housing 20. As a result, the third panel 24 vibrates due to the piezoelectric element 25 being driven.

Accordingly, when the first housing 10 is attached to the second housing 20, the user can hear sound by pressing against the third panel 24.

For example, by the user wrapping the band attached to the band attaching portions 22 around the head, a helmet, or the like, the third panel 24 bends, flexes, or vibrates due to the second piezoelectric element 25 while the third panel 24 is in contact with the head, helmet, or the like. Hence, either vibration sound is transmitted through the head, or air-conducted sound or vibration sound generated by vibration of the helmet or the like is transmitted, so that the user can hear sound.

In the present embodiment, instead of implementing the transmission of a signal from the first housing 10 to the second housing 20 with the output terminals 16 and the input terminals 26, the transmission may be implemented with a wire connecting the first housing 10 and the second housing 20, or transmission from the first housing 10 to the second housing 20 may be implemented by wireless communication means (for example, Bluetooth (trademark), WiFi (trademark), or the like).

Embodiment 4

The following describes Embodiment 4 of the present invention.

Figure 5:
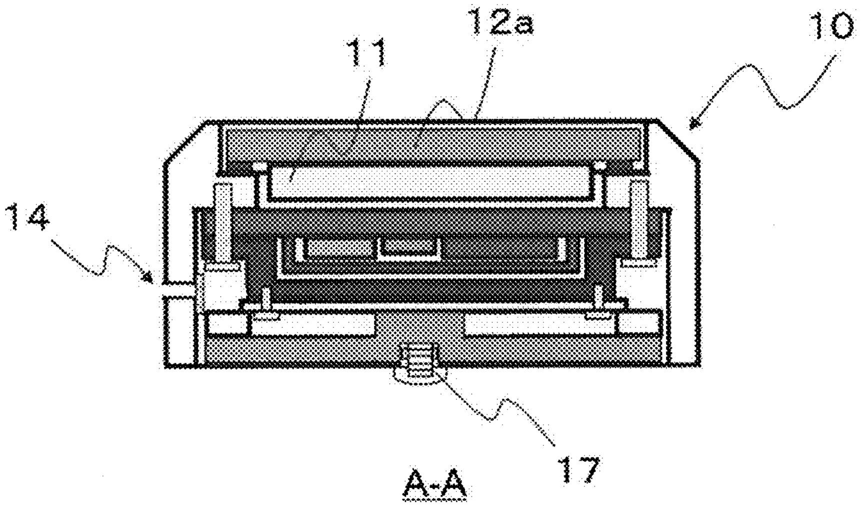
FIG. 5 is an A-A cross-section of the device according to Embodiment 4 of the present invention.

FIG. 5 is an A-A cross-section of a device according to Embodiment 4 of the present invention.

As illustrated in FIG. 5, in a device 1 according to Embodiment 4, as compared to the device 1 according to Embodiment 1, the second panel 12*b* and the first piezoelectric element 13 are removed from the first housing 10, and instead a third piezoelectric element 17 is further provided.

The third piezoelectric element 17 is, for example, a stack-type piezoelectric element.

Upon application of an electric signal (voltage), the third piezoelectric element 17 expands and contracts or vibrates in the upper and lower directions (longitudinal direction).

The third piezoelectric element 17 protrudes from the first housing 10 in a predetermined region on the bottom face of the first housing 10 (the face opposite the face on which the second panel 12*a* is provided).

The periphery of the third piezoelectric element 17 is fixed by the first housing 10 so as not to move to the left or right.

The third piezoelectric element 17 is disposed in a predetermined region on the bottom face of the first housing 10. This predetermined region may be the predetermined region in Embodiment 1, replacing the second panel 12*b* with the bottom face of the first housing 10.

An elastic member is mounted on the tip protruding from the first housing 10 in the third piezoelectric element 17. This elastic member has a coefficient of friction larger than a predetermined value.

As a result, when the tip of the third piezoelectric element 17 is in contact with a helmet or the like, the tip does not easily slip on the surface of the helmet or the like due to the elastic member, thereby suppressing a reduction in sound quality due to the tip slipping along the helmet or the like while vibrating.

With this structure, in the device 1 according to Embodiment 4, by pressing the third piezoelectric element 17 against an object with relatively high rigidity, such as a helmet, the helmet or the like vibrates due to the third piezoelectric element 17, outputting sound.

The means for pressing the third piezoelectric element 17 against the helmet or the like is the band attached to the band attaching portions 22. Once the band is wrapped around a helmet or the like, the tip of the third piezoelectric element 17 protruding from the bottom face of the device 1 is pressed firmly against the helmet or the like. As a result, vibration of the third piezoelectric element 17 is transmitted well to the helmet or the like, and unnecessary movement of the third piezoelectric element 17 with respect to the helmet or the like can be reduced.

Accordingly, via the helmet or the like, the device 1 can transmit sound to the user wearing the helmet or the like.

Embodiment 5

The following describes Embodiment 5 of the present invention.

Figure 6:
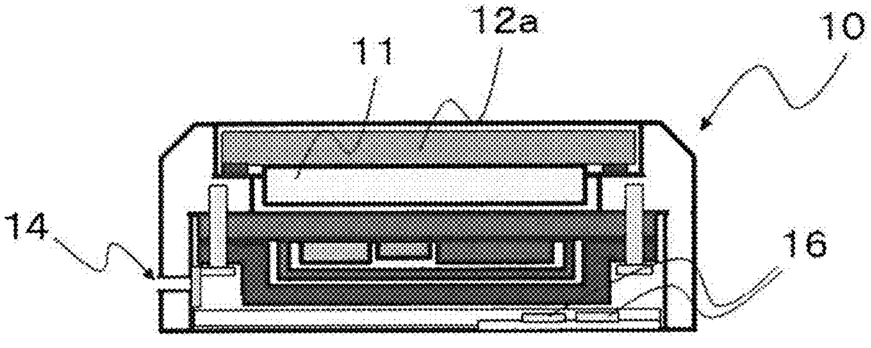
FIG. 6 is an A-A cross-section and a B-B cross-section of the device according to Embodiment 5 of the present invention.
Figure 6:
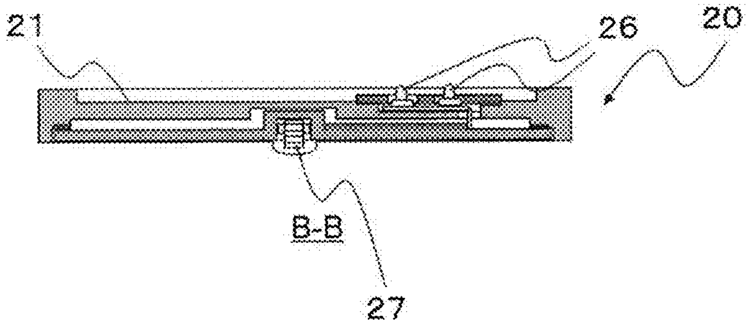

FIG. 6 is an A-A cross-section and a B-B cross-section of a device according to Embodiment 5 of the present invention.

As illustrated in FIG. 6, in a device 1 according to Embodiment 5, as compared to the device 1 according to Embodiment 3, a fourth piezoelectric element 27 is further provided instead of providing the third piezoelectric element 25 and the third panel 24.

The fourth piezoelectric element 27 is similar to the third piezoelectric element 17 provided in the device 1 according to Embodiment 4.

The fourth piezoelectric element 27 is disposed in a predetermined region on the bottom face of the second housing 20 (the face on the opposite side from the seat 21). This predetermined region may be the predetermined region in Embodiment 1, replacing the second panel 12*b* with the bottom face of the second housing 20.

An elastic member is attached to the tip of the fourth piezoelectric element 27. This elastic member may be similar to the elastic member attached to the tip of the third piezoelectric element 17.

With this structure, when the first housing 10 is attached to the seat 21 of the second housing 20, vibration of the third piezoelectric element 17 is transmitted to a highly rigid object, such as a helmet, and due to this vibration, air vibrates to produce sound that is transmitted to the user wearing the helmet or the like.

When the device 1 is fixedly pressed against a helmet or the like by the band attached to the band attaching portions 22 of the second housing 20 being wrapped around the helmet or the like, the tip of the fourth piezoelectric element 27 contacts the helmet or the like under pressure.

In such a case, when the fourth piezoelectric element 27 vibrates, the vibration causes the helmet or the like to vibrate, so that vibration of the fourth piezoelectric element 27 is transmitted to the helmet or the like and to the user wearing the helmet or the like with minimal damping. As a result, louder, higher-quality sound can be transmitted to the user.

Embodiment 6

The following describes Embodiment 6 of the present invention.

Figure 7:
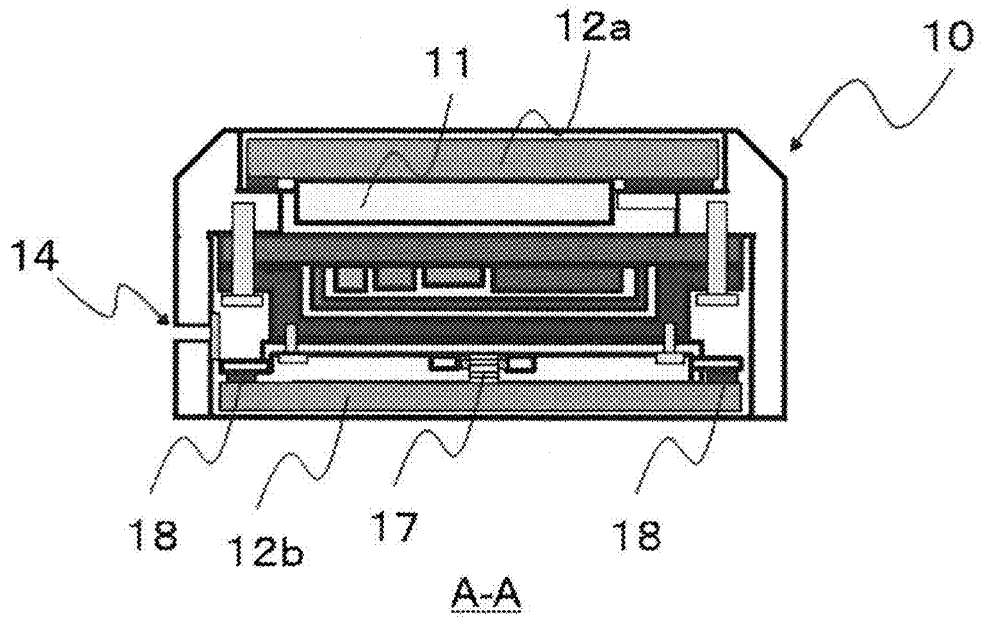
FIG. 7 is an A-A cross-section of the device according to Embodiment 6 of the present invention.

FIG. 7 is an A-A cross-section of the device according to Embodiment 6 of the present invention.

As illustrated in FIG. 7, as compared to the device 1 according to Embodiment 1 of the present invention, the first piezoelectric element 13 is replaced by the third piezoelectric element 17.

The third piezoelectric element 17 is similar to the third piezoelectric element 17 in the device 1 according to Embodiment 4.

The tip of the third piezoelectric element 17 is in contact with a predetermined region of the second panel 12*b*. This predetermined region may be similar to the predetermined region in Embodiment 1.

So that the third piezoelectric element 17 does not move to the left or right in the first housing 10, the third piezoelectric element 17 is surrounded by a movement restricting member or a fixing member. The movement restricting member or the fixing member may, for example, be constituted by a portion of the first housing 10.

Due to the third piezoelectric element 17 expanding and contracting in the upper and lower directions (the directions in which the first panel 12*a* and the second panel 12*b* face each other), the second panel 12*b* in contact with the tip of the third piezoelectric element 17 vibrates.

One end of the third piezoelectric element 17 is in contact with the second panel 12*b*, and the opposite end is in contact with a constituent element in the first housing 10. This constituent element is formed by a highly rigid member (at least more rigid than the second panel 12*b*). As a result, even if the third piezoelectric element 17 expands and contracts, the constituent element undergoes little deformation such as bending. Hence, the one end of the third piezoelectric element 17 is displaced more than the opposite end of the third piezoelectric element 17 is. Therefore, as a result of vibration of the third piezoelectric element 17, the end of the third piezoelectric element 17 by the second panel 12*b* is displaced, thereby greatly vibrating the second panel 12*b*.

Accordingly, a louder sound can be transmitted to the user in contact with the second panel 12*b*.

Embodiment 7

The following describes Embodiment 7 of the present invention.

Figure 8:
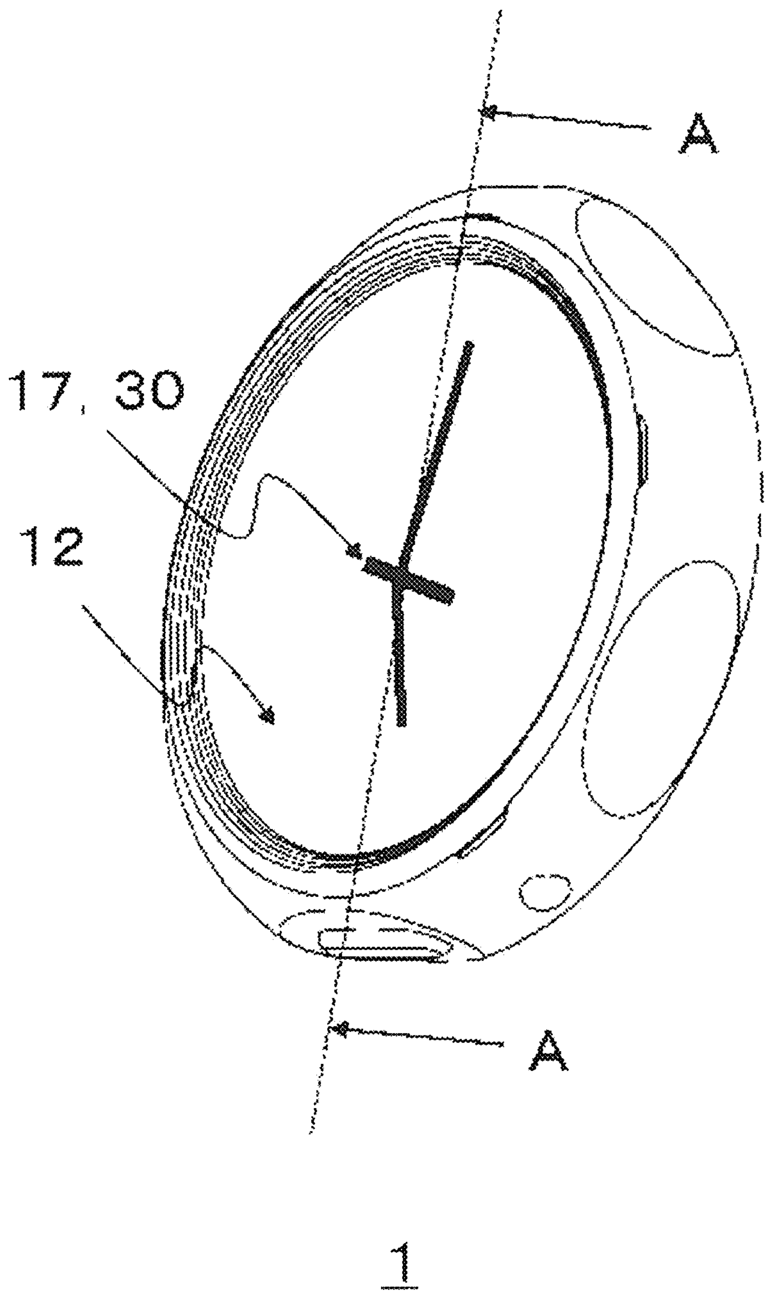
FIG. 8 illustrates a device according to Embodiment 7 of the present invention.

FIG. 8 illustrates the external appearance of a device according to Embodiment 7 of the present invention.

As illustrated in FIG. 8, a device 1 according to Embodiment 7 is provided at least with a panel 12, a third piezoelectric element 17, and a shaft 30.

The panel 12 may, for example, be similar to the panel 12 in the device 1 according to Embodiment 1.

The third piezoelectric element 17 may be similar to the third piezoelectric element 17 in the device 1 according to Embodiment 4.

The shaft 30 is the shaft for the minute hand and the hour hand in a timepiece provided in the device 1.

The shaft 30 includes a hollow cavity therein, and the third piezoelectric element 17 is inserted in the hollow cavity. The inner side of the shaft 30 does not contact the third piezoelectric element 17.

The shaft 30 is positioned in a predetermined region on a planar surface of the panel 12. This predetermined region may be similar to the predetermined region in Embodiment 1.

Figure 9:
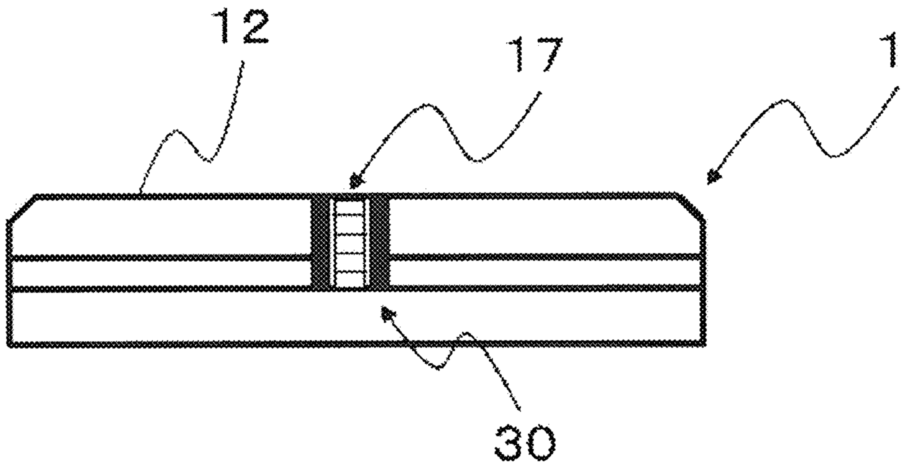
FIG. 9 is an A-A cross-section of the device according to Embodiment 7 of the present invention.

In FIG. 9, the shaft 30 is in contact with the panel 12, yet the shaft 30 need not be in contact with the panel 12. As compared to when the shaft 30 is in contact with the panel 12, the shaft 30 does not obstruct vibration of the panel 12 due to the piezoelectric element 17 when the shaft 30 is not in contact with the panel 12. Hence, sound caused by vibration of the panel 12 becomes louder.

FIG. 9 is an A-A cross-section of the device according to Embodiment 7 of the present invention.

So that the third piezoelectric element 17 does not move to the left or right in the device 1, the third piezoelectric element 17 is surrounded by a fixing member or a movement restricting member. One end of the third piezoelectric element 17 is in contact with the back face of the panel 12, and the opposite end is in contact with or adhered to a highly rigid constituent element in the device 1.

As a result, when the third piezoelectric element 17 expands and contracts, the constituent element in contact with the opposite end of the third piezoelectric element 17 deforms little. The one end of the third piezoelectric element 17 at the side of the panel 12 is therefore displaced more than the opposite end is, thereby causing the panel 12 to vibrate more.

By using the hollow cavity in the shaft 30 of the timepiece as the space for storing the third piezoelectric element 17, the third piezoelectric element 17 can be stored in a housing with little space, and furthermore, when the panel 12 vibrates due to the third piezoelectric element 17 expanding and contracting or the like, sound due to the vibration can be transmitted to the user.

In the present embodiment, the first housing 10 and the second housing 20 are detachable, yet the present invention is not limited to this structure. The first housing 10 and the second housing 20 may be detachable, or the first housing 10 and the second housing 20 may be structured integrally. When the first housing 10 and the second housing 20 are structured integrally, the second panel 12*b* and the first piezoelectric element 13 may be provided on the bottom face of the device 1.

REFERENCE SIGNS LIST

1: Device
10: First housing
11: Display unit
12: Panel (12*a*: First panel, 12*b*: Second panel)
13: First piezoelectric element
14: Microphone hole
15: Hall element
16: Output terminal
17: Third piezoelectric element
18: Adhering member 19: Sound output unit
20: Second housing
21: Seat
22: Band attaching portion
23: Magnet
24: Third panel
25: Second piezoelectric element
26: Input terminal
27: Fourth piezoelectric element
30: Shaft
31: First region
32: Second region
33: Third region
34: Fourth region
35: Fifth region

The invention claimed is:

1. A device comprising:
a first housing including a first surface and a second surface;
a display unit disposed on the first surface;
a panel disposed on the second surface;
a second housing removably attached to the first housing; and
a piezoelectric element disposed in a predetermined region on a planar surface of the panel, wherein
the panel vibrates in response to vibration of the piezoelectric element so as to transmit sound to a human body contacting the panel, and
by the piezoelectric element being disposed in the predetermined region on the planar surface of the panel, a center of the piezoelectric element is located within a range of 40% to 60% of a distance from one edge to another edge of the panel in a first direction and within a range of 40% to 60% of a distance from one edge to another edge of the panel in a second direction perpendicular to the first direction.

2. A device according to claim 1, wherein by the piezoelectric element being disposed in the predetermined region on the planar surface of the panel, a distance from one edge of the panel in a first direction to a center of the piezoelectric element, a distance from another edge of the panel in the first direction to the center of the piezoelectric element, a distance from one edge of the panel in a second direction, which is perpendicular to the first direction, to the center of the piezoelectric element, and a distance from another edge of the panel in the second direction to the center of the piezoelectric element are all 1 cm or more.

3. A device according to claim 1, wherein by the piezoelectric element being disposed in the predetermined region on the planar surface of the panel, a distance from one edge of the panel in a first direction to a center of the piezoelectric element and a distance from another edge of the panel in the first direction to the center of the piezoelectric element are equivalent, and a distance from one edge of the panel in a second direction, which is perpendicular to the first direction, to the center of the piezoelectric element and a distance from another edge of the panel in the second direction to the center of the piezoelectric element are equivalent.

4. The device according to claim 1, wherein the panel is circular.

5. The device according to claim 1, wherein the panel is rectangular.

6. The device according to claim 1, wherein the second surface faces the first surface.

7. The device according to claim 1, further comprising:
a sound output unit in the first housing, wherein
when the first housing is attached to the second housing, the sound output unit outputs sound, and when the first housing is detached from the second housing, the piezoelectric element is driven.

8. The device according to claim 7, wherein the sound output unit is provided on the first surface of the first housing.

9. The device according to claim 8, wherein the sound output unit comprises a piezoelectric element disposed in the first housing.

10. The device according to claim 1, further comprising a band for fixing the device to a predetermined object.

11. A device comprising:
a panel;
a piezoelectric element disposed in a predetermined region on a planar surface of the panel; and
a shaft of a timepiece, wherein
the shaft comprises a hollow cavity, and
the piezoelectric element is inserted in the hollow cavity so that a tip of the piezoelectric element contacts the panel, and
wherein
the panel vibrates in response to vibration of the piezoelectric element so as to transmit sound to a human body contacting the panel, and
by the piezoelectric element being disposed in the predetermined region on the planar surface of the panel, a center of the piezoelectric element is located within a range of 40% to 60% of a distance from one edge to another edge of the panel in a first direction and within a range of 40% to 60% of a distance from one edge to another edge of the panel in a second direction perpendicular to the first direction.

12. The device according to claim 11, wherein the piezoelectric element is a stack-type piezoelectric element.

13. The device according to claim 11, wherein the piezoelectric element does not contact an inner side of the shaft.

* * * * *